United States Patent [19]

Yamazaki et al.

[11] Patent Number: 5,041,201
[45] Date of Patent: Aug. 20, 1991

[54] PLASMA PROCESSING METHOD AND APPARATUS

[75] Inventors: Shunpei Yamazaki, Tokyo; Mitsunori Tsuchiya; Shigenori Hayashi; Naoki Hirose; Noriya Ishida; Mari Sasaki, all of Atsugi; Atsushi Kawano, Isehara, all of Japan

[73] Assignee: Semiconductor Energy Laboratory Co., Ltd., Kanagawa, Japan

[21] Appl. No.: 403,821

[22] Filed: Sep. 7, 1989

[30] Foreign Application Priority Data

Sep. 16, 1988 [JP] Japan ................... 63-233166
Sep. 16, 1988 [JP] Japan ................... 62-233167
Sep. 16, 1988 [JP] Japan ................... 63-233168

[51] Int. Cl.⁵ .................... C23F 4/04; C23C 14/34
[52] U.S. Cl. .................... 204/192.32; 204/192.35; 204/298.34; 118/723; 427/38; 427/39; 156/345; 156/643; 156/646
[58] Field of Search ............ 427/38, 39; 118/50.1, 118/723, 728; 204/192.32, 192.34, 192.35, 298.34, 298.39; 156/345, 643, 646

[56] References Cited

U.S. PATENT DOCUMENTS

| 4,461,783 | 7/1984 | Yamazaki | 118/723 X |
| 4,464,223 | 8/1984 | Gorin . | |
| 4,615,298 | 10/1986 | Yamazaki | 118/723 |
| 4,633,811 | 1/1987 | Maruyama | 118/723 |
| 4,723,508 | 2/1988 | Yamazaki et al. | 118/728 X |
| 4,869,924 | 9/1989 | Ito | 118/723 X |
| 4,873,115 | 10/1989 | Matsumura et al. | 427/39 X |

FOREIGN PATENT DOCUMENTS

| 327,406 | 9/1989 | European . |
| 304,220 | 22/1989 | European . |
| 372,696 | 13/1990 | European . |
| 361,206 | 4/1990 | European . |

Primary Examiner—Nam X. Nguyen
Attorney, Agent, or Firm—Sixbey, Friedman, Leedom & Ferguson

[57] ABSTRACT

Plasma CVD method and apparatus are described. The apparatus comprises a vacuum chamber in which two pairs of electrodes are provided. A high frequency voltage is applied to one of the pairs in order to produce a plasma from a reactive gas in the chamber. A substrate to be coated is located between the other of the pairs. A relatively low frequency voltage is applied to the other pair of electrodes. By virtue of the low frequency voltage, the substrate is exposed to the bombardment of ions of the plasma during deposition. The bombardment functions to remove relatively soft portions of the depositing material.

23 Claims, 4 Drawing Sheets

PLASMA PROCESSING METHOD AND APPARATUS

BACKGROUD OF THE INVENTION

The present invention relates to plasma processing method and apparatus more particularly, it relates to, but not exclusively, a method of adhering a protective film of carbonaceous material to comparatively soft substrates to provide a transparent electrically insulating coating thereon.

Hard, thin films of diamondlike carbon have been deposited on substrates in a number of ways. By "diamondlike carbon" is meant carbon with exceptional hardness, e.g. which can neither be cut with a razor blade, nor scratched by rubbing with steel wool. The chemical bonding appears to be dominated by $sp^3$ tetrahedral diamondlike bonding as opposed to the $sp^2$ trigonal bonding of graphite. Diamondlike carbon films may or may not give evidence of crystallinity by x-rays.

Japanese patent application No. sho 56-146936 describes an example, in which carbon deposition is carried out while the deposited carbon material is subject to the attack of accelerated ions at the same time so that soft portions are selectively removed to leave comparatively hard material. This technique is excellent to increase the hardness of the carbon film thus deposited. Substrates to be coated in accordance with this technique, however, have to be given bias voltages in order to cause sputtering action thereon. For this reason, the advantage of this technique is diminished when the substrates are made of insulating materials.

SUMMARY OF THE INVENTION

It is therefore an object of the present invention to provide a plasma processing apparatus and method of a new type.

In order to accomplish the above and other objects and advantages, a pair of auxiliary electrodes are provided in a vacuum chamber in the both sides of a substrate such as a glass substrate to be treated, besides another pair of electrodes for producing plasma gas in the vacuum chamber. A relatively low frequency voltage is applied between the auxiliary electrodes in order to cause the bombardment of ions of plasma upon the substrate.

By the plasma treatment, hard films can be deposited since the bombardment of ions tends to selectively remove soft portions of the material deposited during the deposition process. When carbonaceous films are formed by use of a carbon compound gas, the hardness and the resistivity can be controlled by adding a fluorine compound gas. The fluorine contained in the carbon film deposited functions also to enhance the water repellant property of the film. Such carbon films are suitable for protective coatings on glass windows of vehicles.

Other substrates suitable for treatment by the present invention are made of, for example insulating materials having resistivities not lower than $10^{15}$ ohm centimeters, such as polyesters, alkyd resins, oil-free alkyd resins, unsarurated polyesters, acrylic resins and aminoresins. Particularly, suitable organic material used in manufacture of motorcars are acrylic lacquers, acrylic melanins and block acrylic urethanes.

BRIEF DESCRIPTION OF THE DRAWING

This invention can be better understood from the following detailed description when read in conjunction with the drawing in which.

DETAILED DESCRIPTION OF THE PREFERRED EMBODIMENTS

Figure 1:
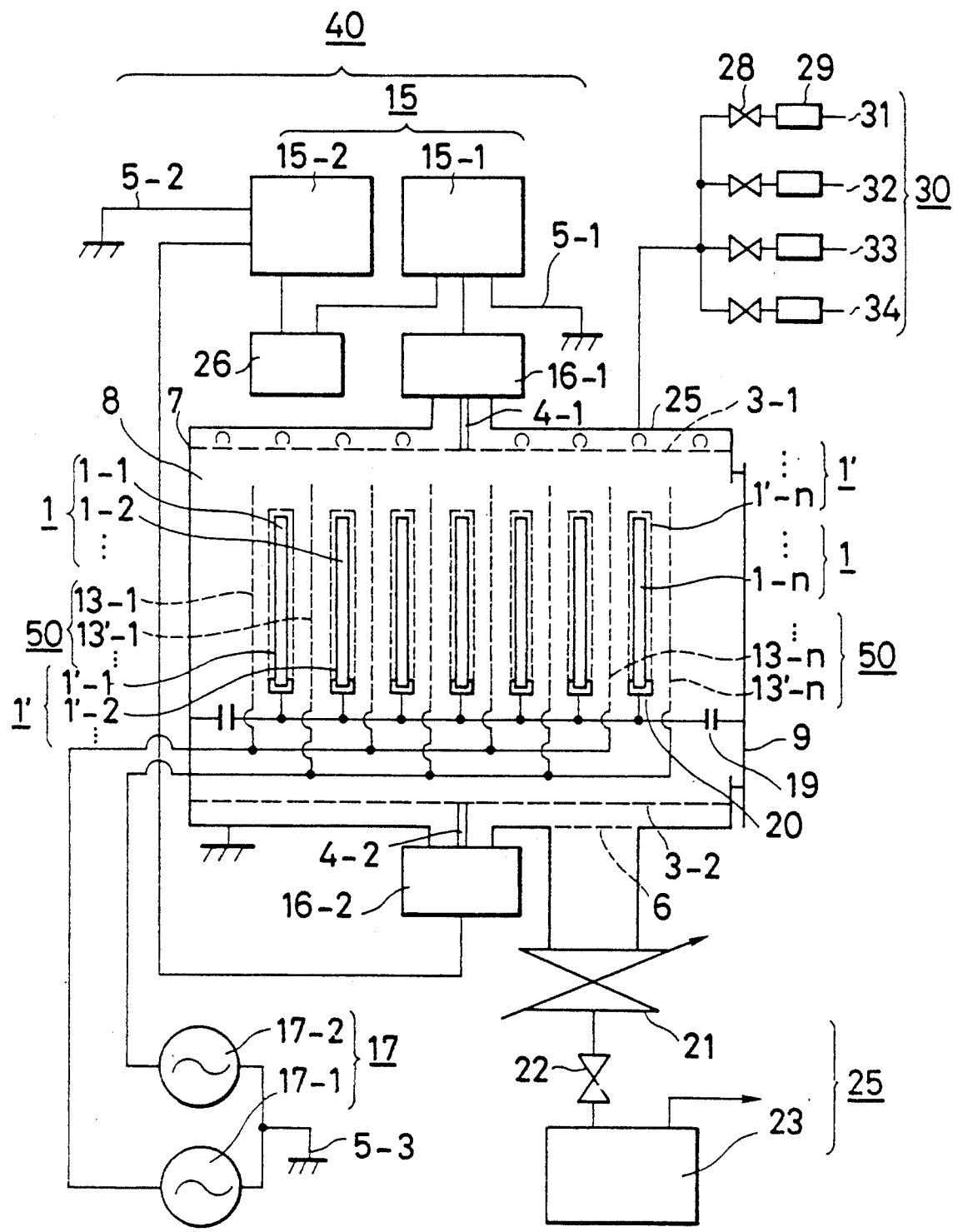
FIG. 1 is a schematic cross sectional diagram showing a plasma CVD apparatus in accordance with one embodiment of the present invention.

Referring now to FIG. 1, a chemical vapor deposition apparatus is illustrated. The apparatus comprises a vacuum chamber 9 defining a deposition space therein, an evacuation system 25 comprising a rotary pump 23 and a turbo molecular pump 22 which are connected to the chamber 7 through a valve 21, a gas supply system 30 comprising four gas feeding lines, each being provided with a flow meter 29 and a valve 28 connected to the reaction chamber 7, a pair of mesh electrodes 3-1 and 3-2 made of alminum and located at the upper and lower positions of the inside of the depositino space, a power supply 40 for supplying energy to the mesh electrodes 3-1 and 3-2, a plurality of substrate hoders 20 for holding substrates 1, the holders 20 being connected to the chamber 7 through capacitors 19, a plurality of Al mesh electrodes 50 (13-n, 13-n') each being interposed between adjacent substrates, a bias voltage applying means 17 for applying an AC voltage between adjacent ones of the electrodes 50. The reaction chamber 7 is provided with a gate valve 9 through which substrates to be coated are disposed in the chamber.

The energy supply 40 comprises a first power source 15-1 which supplies an AC voltage to the mesh electrode 3-1 through a matching device 16-1 comprising a LCR circuit, a second power source 15-2 which supplies an AC voltage to the mesh electrode 3-2 through a matching device 16-2 comprising a LCR circuit, and a phase adjuster 26 connected between the first and second powder sources 15-1 and 15-2. Both the first and second power sources have grounded at terminals 5-1 and 5-2. The bias applying device 17 is provided with first and second AC voltage sources 17-1 and 17-2, which supply AC voltages between adjacent electrodes 13-n and 13-n'. One terminals of the voltage sources 17-1 and 17-2 are ground at 5-3.

In operation, after evacuating the chamber 7, a carbon compound gas is introduced into the deposition space 8 at 0.001 to 1 Torr. For example, the carbon compound gas consists of $C_2F_6$ and $C_2H_4$ in the ratio of from 1:4 to 4:1, e.g. 1:1 and introduced so that the pressure in the reaction chamber 7 becomes 0.5 Torr. The transparency and resistivity of the carbon material can be controlled by changing the amount of fluorine contained in carbon material to be deposited through the adjustment of the introduction rate of $C_2F_6$ to $C_2H_4$. The temperature in the deposition space is no higher than 150° C. Alternate voltages of from 1 MHz to 100 MHz, e.g. 13.56 MHz, are applied to the mesh electrodes 3-1 and 3-2 from the first and second power sources 15-1 and 15-2. The phase difference between them is adjusted to be 0° or 180° by means of the phase adjuster 26. By virtue of the high frequency electric voltage, the carbon compound gas is converted into plasma state and carbon deposition is carried out on the substrates. The deposition speed is from 100 to 1000 Å/min. The thickness of the deposited carbon films may be 0.1 to 8 micrometers on flat surfaces and 1 to 3 micrometers on projected surfaces. At the same time, an AC voltage is applied between adjacent electrodes 13-n and 13-n' in order to induce an electric field normal to each substrate. The frequency of the AC voltage between the electrodes 13-n and 13-n' is selected to be in the range of from 10 Hz and 100 KHz, e.g., 50 Hz. At such comparatively low frequencies, ions of the plasma can follow the electric field and bombard against the substrate surface on which carbon deposition is being carried out. As a result, the hardness of the carbon material deposited becomes high, e.g. 600 to 6000 kg/mm$^2$. The resistivity of the carbon is for example from $1 \times 10^6$ to $5 \times 10^{12}$ ohm centimeter, tipically from $1 \times 10^7$ to $1 \times 10^{11}$ ohm centimeter. The optical energy band gap is no narrower than 1.0 eV, typically 1.5 to 5.5 eV. The carbon material includes hydrogen at 30 atom % or less and fluorine at 0.3 to 10 atom%.

Figure 2A:
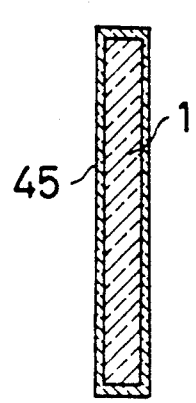
FIGS. 2(A) and 2(B) are vertical and horizontal cross sectional views showing a window glass for motor cars which has been coated with a carbon protective film in accordance with the present invention.
Figure 2B:
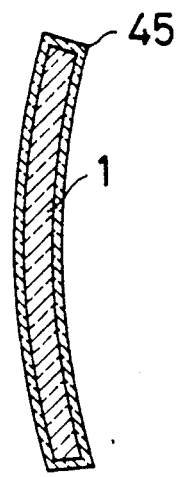
Figure 2C:
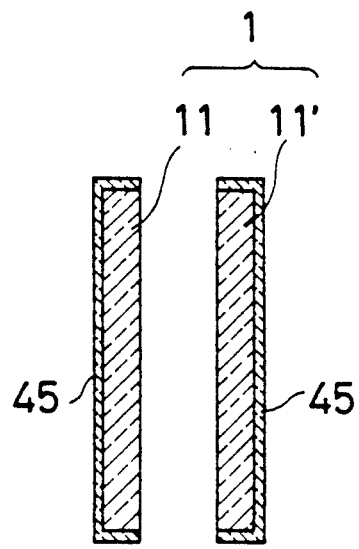
FIG. 2(C) is a schematic cross sectional view showing a modification of the embodiment shown in FIGS. 2(A) and 2(B).
Figure 3A:
FIGS. 3(A) and 3(B) are horizontal and perspective cross sectional views showing a cylinder coated with a carbon protective film in accordance with the present invention.
Figure 3B:
Figure 4A:
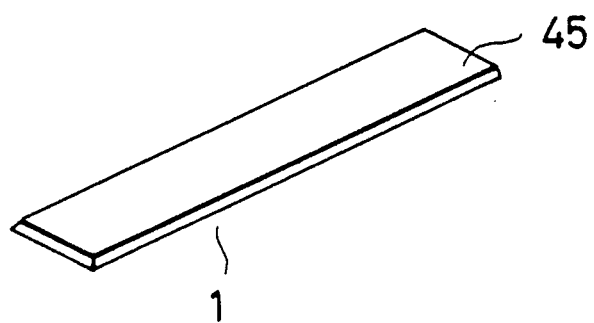
FIGS. 4(A) and 4(B) are perspective and cross sectional views showing a rule coated with a carbon protective film in accordance with the present invention.
Figure 4B:
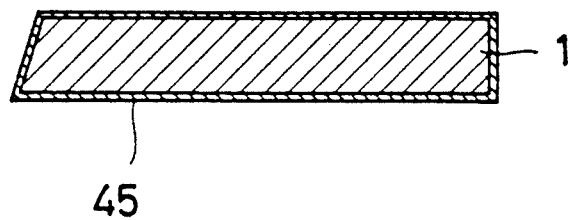
Figure 5A:
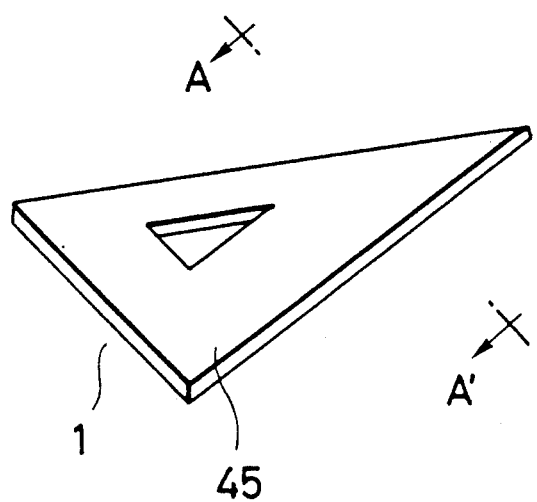
FIGS. 5(A) and 5(B) are perspective and cross sectional views showing a set square coated with a carbon protective film in accordance with the present invention.
Figure 5B:
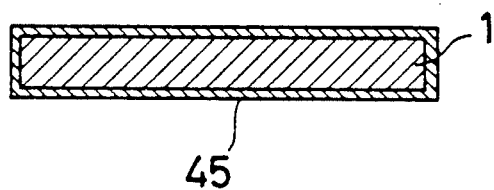

Carbonaceous films were coated on several substrates in accordance with the present invention. FIGS. 2(A) and 2(B) are horizontal and vertical cross sectional views showing a curved glass or plastic pane 1 to be fit in the front window of a motor car coated with a carbonaceous film 45 of 0.1 to 8 micrometers. The whole surface of the glass pane 1 is coated with a carbon film in accordance with the present invention. This film can be coated only one side of the pane. In this case, the panes treated in the apparatus shown in FIG. 1 are disposed in parallel with each other in order to make pairs as illustrated in FIG. 2(C). FIGS. 3(A) and 3(B) illustrate a carbon coating formed on a cylindrical substrate. FIGS. 4(A) and 4(B) illustrate a carbon coating formed on a plastic rule 1. The thickness of the coating 41 is 0.1 to 8 micronmeters for example. FIGS. 5(A) and 5(B) illustrate a carbon coating formed on a set square. The thickness of the coating is 0.5 micrometer.

While several embodiments have been specifically described by way of examples, it is to be appreciated that the present invention is not limited to the particular examples described and that modifications and variations can be made without departing from the scope of the invention as defined by the appended claims. For example, the present invention is usuful when front, side or rear windows or side mirrors are coated with carbon protective films.

What is claimed is:

1. A plasma processing apparatus comprising:
   a vacuum chamber;
   a vacuum pump connected to said vacuum chamber in order to evacuate said chamber;
   a gas introduction system connected to said vacuum chamber in order to input a reactive gas into said chamber;
   a pair of first electrodes provided in said vacuum chamber;
   a first voltage source for applying a first alternating voltage between said first electrodes in order to convert the reactive gas in said vacuum chamber into a plasma;
   a substrate holder for supporting at least one substrate to be treated by said apparatus between said first electrodes;
   at least a pair of second electrodes arranged in order that the substrate supported by said holder is located between said pair of second electrodes, said substrate being insulated and spaced apart from said second electrodes; and
   a second voltage source for applying a second alternating voltage between said pair of second electrodes, thereby, enhancing sputtering of a surface of said substrate, wherein said substrate is spaced apart from said second electrodes.

2. The apparatus of claim 1 wherein the frequency of said first alternating voltage is selected in the range of from 1 MHz to 50 MHz.

3. The apparatus of claim 2 wherein the frequency of said second alternating voltage is selected in the range of from 10 Hz to 100 KHz.

4. The apparatus of claim 3 wherein said substrate holder is adapted to support a plurality of substrates in order that said substrates are arranged in parallel apart from each other.

5. The apparatus of claim 4 wherein said second electrodes are located respectively between adjacent ones of said substrates.

6. The apparatus of claim 1 wherein said at least one substrate is arranged perpendicularly to said first electrodes and parallel with said second electrodes.

7. The apparatus of claim 1 wherein said substrate is comprised of an insulating material.

8. The apparatus of claim 7 wherein said substrate is a window of a vehicle.

9. The apparatus of claim 7 wherein said insulating material is selected from the group consisting of: polyesters, alkyd resins, unsaturated polyesters, acrylic resins and aminoresins.

10. The apparatus of claim 1 wherein said substrate holder is isolated from said reaction chamber by virtue of a capacitor.

11. The apparatus of claim 1 wherein said plasma processing is an etching process.

12. The apparatus of claim 1 wherein said plasma processing is a deposition process.

13. A method of treating a substrate by plasma processing in a vacuum chamber comprising:
    disposing said substrate between a pair of first electrodes in said vacuum chamber;
    inputting a reactive gas into said vacuum chamber at an appropriate pressure; and inputting a first alternating voltage between said first electrodes in order to produce a plasma from said reactive gas and to perform plasma processing of said substrate;
    wherein a second alternating voltage is applied between a pair of second electrodes which are located sandwiching said substrate and are insulated and spaced apart from said substrate thereby, increasing a sputtering effect of a surface of said substrate with said plasma.

14. The method of claim 13 wherein said substrate is made from an insulating material.

15. The method of claim 14 wherein said reactive gas is decomposed in order to deposit a film on said substrate.

16. The method of claim 15 wherein said reactive gas is a carbon compound gas.

17. The method of claim 16 wherein said film is made of a diamondlike carbon.

18. The method of claim 17 wherein the resistivity of said diamond-like carbon is from $1 \times 10^6$ to $5 \times 10^{12}$ ohm-centimeter.

19. The method of claim 13 wherein the frequency of said first alternating voltage is from 1 MHz to 50 MHz.

20. The method of claim 19 wherein the frequency of said second alternating voltage is from 10 Hz to 100 kHz.

21. The method of claim 13 wherein said plasma processing is an etching process.

22. A method for depositing a carbonaceous film on a substrate in a vacuum chamber comprising the steps of:
    disposing said substrate between a pair of first electrodes in said vacuum chamber;
    inputting a reactive gas including a carbon compound gas into said vacuum chamber; and
    inputting a first alternating voltage between said first electrodes in order to produce a plasma from said reactive gas and to deposit a carbonaceous film on said substrate,
    wherein said method further comprising the step of applying a second alternating voltage between a pair of second electrodes located sandwiching said substrate and said substrate being insulated and, spaced apart from said second electrodes in order that a sputtering effect to a surface of said substrate with said plasma can be increased.

23. The method of claim 22 wherein the frequency of said first alternating voltage is from 1 MHz to 50 MHz and that of said second alternating voltage is from 10 Hz to 100 kHz.

* * * * *